United States Patent
Lopatin et al.

(10) Patent No.: US 6,703,307 B2
(45) Date of Patent: Mar. 9, 2004

(54) METHOD OF IMPLANTATION AFTER COPPER SEED DEPOSITION

(75) Inventors: Sergey D. Lopatin, Santa Clara, CA (US); Paul R. Besser, Sunnyvale, CA (US); Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 144 days.

(21) Appl. No.: 09/994,358

(22) Filed: Nov. 26, 2001

(65) Prior Publication Data

US 2004/0023486 A1 Feb. 5, 2004

(51) Int. Cl.$^7$ .............................................. H01L 21/44
(52) U.S. Cl. ...................... 438/653; 438/687; 438/628; 438/553
(58) Field of Search ................................ 438/653, 628, 438/629, 654, 687, 553

(56) References Cited

U.S. PATENT DOCUMENTS

| | | | |
|---|---|---|---|
| 5,004,520 A | 4/1991 | Tsuji et al. ................ | 156/630 |
| 5,243,222 A | 9/1993 | Harper et al. .............. | 257/774 |
| 5,300,462 A | 4/1994 | Kakumu .................... | 437/245 |
| 5,552,341 A | 9/1996 | Lee ........................... | 437/192 |
| 5,654,245 A | 8/1997 | Allen ........................ | 438/629 |
| 5,770,517 A | 6/1998 | Gardner et al. ........... | 438/627 |
| 5,821,168 A | 10/1998 | Jain .......................... | 438/692 |
| 5,882,738 A | 3/1999 | Blish, II et al. .......... | 427/526 |
| 5,899,740 A | 5/1999 | Kwon ....................... | 438/627 |
| 5,969,422 A | 10/1999 | Ting et al. ................ | 257/762 |
| 6,015,749 A * | 1/2000 | Liu et al. ................. | 438/628 |
| 6,069,068 A | 5/2000 | Rathore et al. ........... | 438/628 |
| 6,090,710 A | 7/2000 | Andricacos et al. ...... | 438/687 |
| 6,096,648 A | 8/2000 | Lopatin et al. ........... | 438/687 |
| 6,117,770 A | 9/2000 | Pramanick et al. ....... | 438/659 |
| 6,156,638 A | 12/2000 | Agarwal et al. .......... | 438/627 |
| 6,180,522 B1 | 1/2001 | Hong ........................ | 438/659 |
| 6,225,221 B1 * | 5/2001 | Ho et al. .................. | 438/678 |

(List continued on next page.)

FOREIGN PATENT DOCUMENTS

| | | |
|---|---|---|
| EP | 0 567 867 A2 | 11/1993 |
| EP | 1 039 531 A2 | 9/2000 |
| EP | 1 039 531 A3 | 12/2000 |
| EP | 1 094 515 A2 | 4/2001 |

OTHER PUBLICATIONS 4.7.3 General Reliability Issues Associated with IC Interconnects; Silicon Processing for the VLSI Era; vol. II, pp. 264–265.

James A. Cunningham, "Improving Copper Interconnects: A Search for Useful Dopants," Semiconductor International, (Apr., 2000), pp. 1–8.

Dong Joon Kim et al, "New Method to Prepare W–B$^+$–N Ternary Barrier to Cu diffusion by Implanting $BF_2^+$ Ions Into W–N Thin Film," J. Vac. Sci. Technol. B 17(4), Jul./Aug., 1999, pp. 1598–1601.

W. F. McArthur et al., "Structural and Electrical Characterization of Si–Implanted Tin as a Diffusion Barrier for Cu Metallization," Mat. Res. Soc. Symp. Proc. vol. 391, 1995, pp. 327–332.

(List continued on next page.)

*Primary Examiner*—Richard Elms
*Assistant Examiner*—Brad Smith
(74) *Attorney, Agent, or Firm*—Foley & Lardner

(57) ABSTRACT

A method of fabricating an integrated circuit can include forming a barrier layer along lateral side walls and a bottom of a via aperture, forming a seed layer proximate and conformal to the barrier layer, and forming an implanted layer proximate and conformal to the barrier layer and the seed layer. The via aperture is configured to receive a via material that electrically connects a first conductive layer and a second conductive layer.

22 Claims, 3 Drawing Sheets

U.S. PATENT DOCUMENTS

| | | | |
|---|---|---|---|
| 6,242,808 B1 | 6/2001 | Shimizu et al. | 257/762 |
| 6,268,291 B1 * | 7/2001 | Andricacos et al. | 438/694 |
| 6,294,836 B1 | 9/2001 | Paranjpe et al. | 257/767 |
| 6,297,146 B1 | 10/2001 | Lopatin | 438/625 |
| 6,344,413 B1 | 2/2002 | Zurcher et al. | 438/678 |
| 6,365,502 B1 | 4/2002 | Paranjpe et al. | 438/622 |
| 6,399,496 B1 | 6/2002 | Edelstein et al. | 438/687 |
| 6,410,383 B1 | 6/2002 | Ma | 438/247 |
| 6,420,262 B1 | 7/2002 | Farrar | 438/652 |
| 6,426,289 B1 | 7/2002 | Farrar | 438/670 |
| 6,461,675 B2 | 10/2002 | Paranjpe et al. | 427/250 |
| 6,482,740 B2 | 11/2002 | Soininen et al. | 438/686 |
| 6,521,532 B1 | 2/2003 | Cunningham | 438/687 |
| 6,534,865 B1 * | 3/2003 | Lopatin et al. | 257/751 |
| 2001/0035237 A1 | 11/2001 | Nagano et al. | 148/430 |
| 2002/0036309 A1 | 3/2002 | Sekiguchi et al. | 257/301 |
| 2002/0039542 A1 | 4/2002 | Bogel et al. | 420/492 |
| 2002/0053741 A1 | 5/2002 | Iwasaki et al. | 257/762 |
| 2002/0084529 A1 | 7/2002 | Dubin et al. | 257/774 |
| 2002/0102838 A1 | 8/2002 | Paranjpe et al. | 438/622 |
| 2002/0109233 A1 | 8/2002 | Farrar | 257/762 |
| 2002/0115292 A1 | 8/2002 | Andricacos et al. | 438/687 |
| 2002/0137332 A1 | 9/2002 | Paranjpe et al. | 438/637 |

OTHER PUBLICATIONS

PCT International Search Report, International Application No. PCT/US 02/32605, International Filing Date Nov. 10, 2002 (7 pages).

PCT International search Report, International Application No. PCT/US 02/32554, International Filing Date Nov. 10, 2002 (5 pages).

* cited by examiner

METHOD OF IMPLANTATION AFTER COPPER SEED DEPOSITION

CROSS REFERENCE TO RELATED APPLICATIONS

This application is related to U.S. patent application Ser. No. 09/994,395, entitled METHOD OF USING TERNARY COPPER ALLOY TO OBTAIN A LOW RESISTANCE AND LARGE GRAIN SIZE INTERCONNECT; U.S. patent application Ser. No. 10/123,751, entitled USE OF ULTR-LOW ENERGY ION IMPLANTATION (ULEII) TO FORM ALLOY LAYERS IN COPPER; U.S. patent application Ser. No. 09/994,400, entitled METHOD OF INSERTING ALLOY ELEMENTS TO REDUCE COPPER DIFFUSION AND BULK DIFFUSION and U.S. patent application Ser. No. 09/994,397, entitled METHOD OF IMPLANTING COPPER BARRIER MATERIAL TO IMPROVE ELECTRICAL PERFORMANCE which are all assigned to the same assignee as this application.

FIELD OF THE INVENTION

The present invention relates generally to integrated circuits and methods of manufacturing integrated circuits. More particularly, the present invention relates to implantation after copper (Cu) seed deposition.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC. Nevertheless, there are many factors that make the continued miniaturization of ICs difficult. For example, as the size of vias (or pathways between integrated circuit layers used to electrically connect separate conductive layers) decreases, electrical resistance increases.

Conventional integrated circuits utilize vias to connect structures (e.g., gates, drain regions, source regions) and conductive lines. A via is typically a metal plug which extends through an insulative layer. A barrier layer is used to protect the via from metal diffusion and from electromigration (EM). The barrier layer can contribute significantly to resistance associated with the via metal. Electromigration is the mass transport due to momentum exchange between conducting electrons and diffusing metal atoms. Electromigration causes progressive damage to the metal conductors in an integrated circuit. In general, it is characteristic of metals at very high current density and temperatures of 100° C. or more.

Integrated circuit manufacturers have attempted to reduce via resistance as the via size decreases by reducing the thickness of the barrier material. According to one conventional process, plasma vapor deposition (PVD), IC manufacturers deposit a very thin barrier material at the bottom of the via due to non-conformal deposition. The thickness of the barrier material is reduced by chemical vapor deposition (CVD) or atomic layer deposition (ALD) processes. These advanced deposition processes form highly conformal barrier metal films. However, reducing the barrier thickness causes the barrier to become more permeable to copper (Cu) diffusion, which can adversely affect resistance to electromigration.

FIG. 1 illustrates a schematic cross-sectional view of a portion 100 of an integrated circuit including a copper layer 110, a copper via 120, a copper layer 130, a dielectric layer 150, and a dielectric layer 160. Via 120 and copper layer 130 are separated by a barrier layer 140.

Portion 100 also includes a dielectric layer 142 that is separated from copper layer 130 by an etch stop layer 144. Dielectric layer 142 can be oxide and etch stop layer 144 can be Silicon Nitride (SiN). Etch stop layer 144 prevents diffusion of copper from copper layer 130 into dielectric layer 142. Dielectric layer 150 can be separated from copper layer 130 by a barrier layer 152. Similarly, dielectric layer 160 can be separated by copper layer 110 by a barrier layer 162. Barrier layers 152 and 162 can be Tantalum Nitride (TaN). Etch stops layers 172, 174, 176, and 178 can also be provided to separate various sections or layers. Etch stop layers 172, 174, 176, and 178 can be Silicon Nitride (SiN).

According to conventional processes, barrier layer 140 can have a cross-sectional thickness of between 7 nm to 25 nm. Barrier layer 140 inhibits diffusion of copper ions from layers into via 120 and from via into dielectric layer 142. Conventional barrier layers can include Tantalum Nitride (TaN).

FIG. 1 shows a portion formed according to a dual damascene process where copper layer 110 and copper via 120 are deposited in one step or process and are not separated by a barrier.

As discussed above, conventional systems have attempted to reduce the thickness of barrier layer 140 to reduce the resistance associated with via 120. However, this reduction in thickness can cause electromigration failures. FIG. 2 illustrates portion 100 described with reference to FIG. 1, further having an EM failure or void 145 in copper layer 130. FIG. 2 shows a portion formed according to a dual damascene process (as described with reference to FIG. 1) where copper layer 110 and copper via 120 are formed in one step or process.

FIG. 3 illustrates portion 100 having an EM failure or void 155 in via 120 due to bulk diffusion from copper layer 110. FIG. 3 shows a portion formed according to a dual damascene process (as described with reference to FIG. 1) where copper layer 110 and copper via 120 are formed in one step or process.

Electromigration failures have been described by Stanley Wolf, Ph.D. in *Silicon Processing for the VLSI Era*, Lattice Press, Sunset Beach, Calif., Vol. 2, pp. 264–65 (1990). Dr. Wolf explains that a positive divergence of the motion of the ions of a conductor leads to an accumulation of vacancies, forming a void in the metal. Such voids may ultimately grow to a size that results in open-circuit failure of the conductor line.

Thus, there is a need for a barrier that is more resistant to copper diffusion. Further, there is a need for a method of implanting barrier material after copper seed deposition. Even further, there is a need for a method of enhancing barrier properties by providing an interfacial layer proximate a seed layer. Further, there is a need of implanting elements into seed layer.

SUMMARY OF THE INVENTION

An exemplary embodiment is related to a method of fabricating an integrated circuit. This method can include forming a barrier layer along lateral side walls and a bottom of a via aperture, forming a seed layer proximate and conformal to the barrier layer, and forming an implanted layer proximate and conformal to the barrier layer and the seed layer. The via aperture is configured to receive a via material that electrically connects a first conductive layer and a second conductive layer.

Another exemplary embodiment is related to a method of implantation after copper seed deposition in an integrated circuit fabrication process. This method can include providing a first conductive layer over an integrated circuit substrate, providing a conformal layer section at a bottom and sides of a via aperture positioned over the first conductive layer to form a barrier separating the via aperture from the first conductive layer, implanting an element into the conformal layer section to form an implanted layer in the conformal layer section, filling the via aperture with a via material, and providing a second conductive layer over the via material such that the via material electrically connects the first conductive layer to the second conductive layer.

Another exemplary embodiment is related to a method of forming a via in an integrated circuit. This method can include depositing a first conductive layer, depositing an etch stop layer over the first conductive layer, depositing an insulating layer over the etch stop layer, forming an aperture in the insulating layer and the etch stop layer, providing a barrier material at a bottom and sides of the aperture to form a barrier layer, providing a seed layer over the barrier layer, providing an implant into the barrier layer and seed layer to form an implant layer, filling the aperture with a via material, and providing a second conductive layer over the via such that the via electrically connects the first conductive layer and the second conductive layer.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 4:
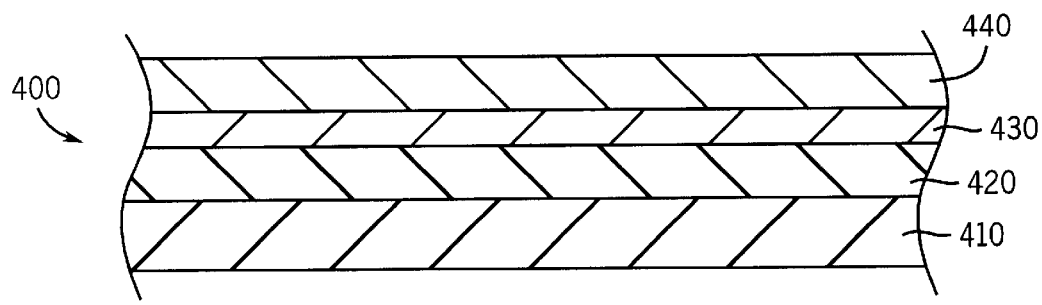
FIG. 4 is a schematic cross-sectional view representation of a portion of an integrated circuit, showing a seed/barrier interfacial layer in accordance with an exemplary embodiment.

Referring to FIG. 4, a portion 400 of an integrated circuit includes a substrate layer 410, a barrier layer 420, a seed/ barrier interfacial layer 430, and a seed layer 440. Substrate 410 can be a dielectric layer or any of a variety of different layers into which diffusion or migration is not wanted.

Barrier layer 420 is provided to prevent diffusion of material into substrate layer 410. Barrier layer 420 can be Tantalum (Ta), Tantalum Nitride (TaN), Titanium Silicon Nitride (TiSiN), or any of a variety of other barrier materials. As an example, barrier layer 420 can have a cross-sectional thickness of 30–70 Angstroms. Seed layer 440 can include copper (Cu) or a copper alloy and can have a cross-sectional thickness of 100–300 Angstroms.

In a first exemplary embodiment, seed/barrier interfacial layer 430 can include different elements which are implanted to form a mixed region with a uniform distribution of elements. For example, seed/barrier interfacial layer 430 can include metallic elements of $6^{th}$ period (Ta, W, Re, Os, Ir, Pt), metallic elements of $5^{th}$ period (Nb, Mo, Ru, Rh, Pd), and/or metallic elements of $4^{th}$ period (V, Cr, Fe, Co, Ni). Such elements have the characteristics of forming metallic materials with highest melting point and highest density. As an example, seed/barrier interfacial layer 430 can have a cross-sectional thickness of 10–30 Angstroms. In a preferred case the seed/barrier interfacial layer includes Re or Cr.

Implants forming seed/barrier interfacial layer 430 can be deposited using ultra low energy ion implantation (ULEII). Using ULEII allows for implantation of a multitude of elements into seed layer 440 without having to manufacture copper alloy targets, as are used in plasma vapor deposition (PVD) tools. ULEII also allows for control of implant concentration and depth. Advantageously, uniform distribution of elements in seed/barrier interfacial layer 430 can improve electromigration (EM) reliability and adhesion between seed layer 440 and barrier layer 420.

Figure 5:
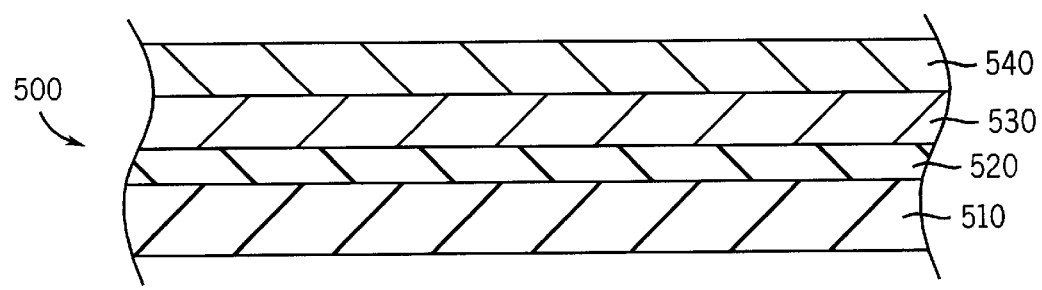
FIG. 5 is a perspective cross-sectional view representation of a portion of an integrated circuit, showing a barrier/dielectric interfacial layer in accordance with another exemplary embodiment.

Referring to FIG. 5, a portion 500 of an integrated circuit includes a dielectric layer 510, a barrier/dielectric interfacial layer 520, a barrier layer 530, and a seed layer 540. Dielectric layer 510 can be any of a variety of dielectrics including an interlevel dielectric (ILD). Dielectric layer 510 can be a layer through which a via aperture is formed in the creation of a via as described with reference to FIG. 7.

In a second exemplary embodiment, barrier/dielectric interfacial layer 520 can include different elements that are implanted to form a mixed region with a uniform distribution of elements. Barrier/dielectric interfacial layer 520 can include C, B, P, Si, N, Al, As, Ga, or Ge elements. As an example, barrier/dielectric interfacial layer 520 can have a cross-sectional thickness of 10–30 Angstroms. In a preferred case the barrier/dielectric interfacial layer includes P or Al.

Advantageously, uniform distribution of elements in barrier/dielectric interfacial layer 520 can improve adhesion between barrier layer 530 and dielectric layer 510. As with seed/barrier interfacial layer 430, barrier/dielectric interfacial layer 510 can be formed in a ULEII process that allows for implantation of a multitude of elements without needing barrier alloy targets, such as, those targets used in PVD tools.

Figure 6:
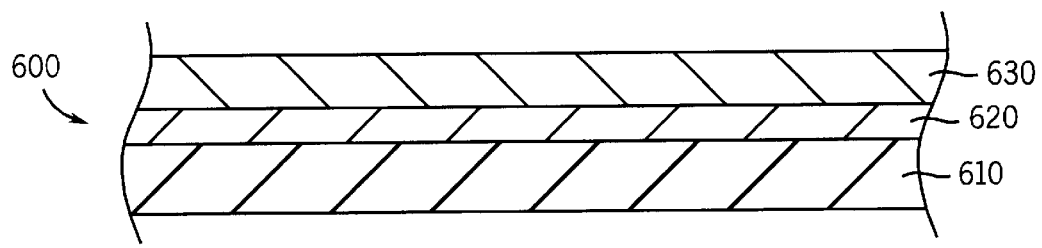
FIG. 6 is a perspective cross-sectional view representation of a portion of an integrated circuit, showing a seed implanted layer in accordance with another exemplary embodiment.

Referring to FIG. 6, a portion 600 of an integrated circuit includes a dielectric layer 610, a barrier layer 620, and a seed implanted layer 630. Dielectric layer 610 can include any of a variety of dielectrics. Dielectric layer 610 can be a layer through which a via passes to electrically connect layers as described in reference to FIG. 7.

Barrier layer 620 can be Tantalum (Ta), Tantalum Nitride (TaN), Titanium Silicon Nitride (TiSiN), or any other barrier material. Barrier layer 620 can have a cross-sectional thickness of 30–70 Angstroms. Barrier layer 620 can be deposited by ALD and/or CVD.

In a third exemplary embodiment, implantation of elements into seed implanted layer 630 can modify the Cu-alloy in seed implanted layer 630, forming a modified alloy layer and improving electromigration reliability. Implanted elements in seed implanted layer 630 can include Zn, Sn, Cr, Ca, Ag, or In. Implantation can involve use of a ULEII process. Alternatively, seed implanted layer 630 can be deposited by PVD, CVD, or ALD. As an example, seed implanted layer 630 has a thickness of 10–30 Angstroms. In an exemplary embodiment, a thermal process is used to facilitate the intermixing of implants with the copper alloy in seed implanted layer 630. In a preferred case the seed implanted layer includes Zn or Ca. Selected elements can form CuZn and CuCa layers, which provide seed implanted layers with lowered electrical resistance. These CuZn and CuCa seed layers also form interconnects with increased electromigration resistance.

Advantageously, the exemplary embodiments described with reference to FIGS. 4–6 can form an EM resistant layer or section that improves reliability. The EM resistant layer or section includes an implanted layer that is as part of a section of layers. For example, seed/barrier interfacial layer 430 described with reference to FIG. 4 is an implanted layer positioned between barrier layer 420 and seed layer 440. As another example, barrier/dielectric interfacial layer 520 described with reference to FIG. 5 is an implanted layer positioned between dielectric layer 510 and barrier layer 530. As yet another example, seed implanted layer 630 described with reference to FIG. 6 is an implanted layer proximate barrier layer 620.

The multiple layers that include seed/barrier interfacial layer 430, barrier/dielectric interfacial layer 520, and seed implanted layer 630 and described with reference to FIGS. 4–6 can be included in a conformal layer section in a trench used for a via. The via can be configured to electrically connect two layers, such as, two conductive layers separated by a dielectric layer and connected by a via.

Figure 1:
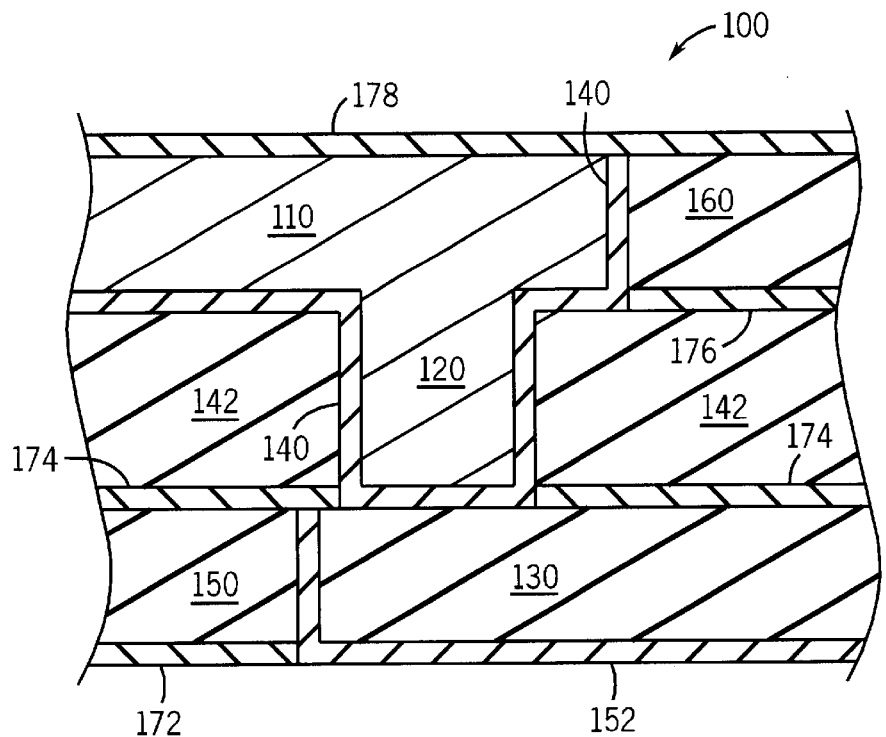
FIG. 1 is a schematic cross-sectional view representation of a dual damascene portion of an integrated circuit fabricated in accordance with prior art.
Figure 2:
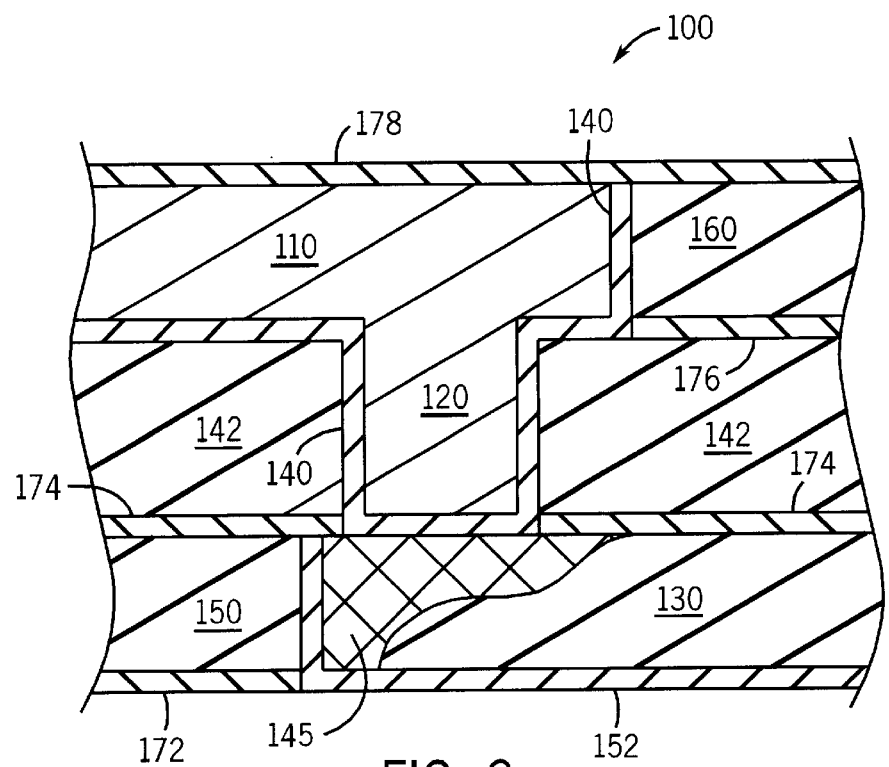
FIG. 2 is a schematic cross-sectional view representation of the dual damascene portion of the integrated circuit illustrated in FIG. 1, showing an electromigration failure.
Figure 3:
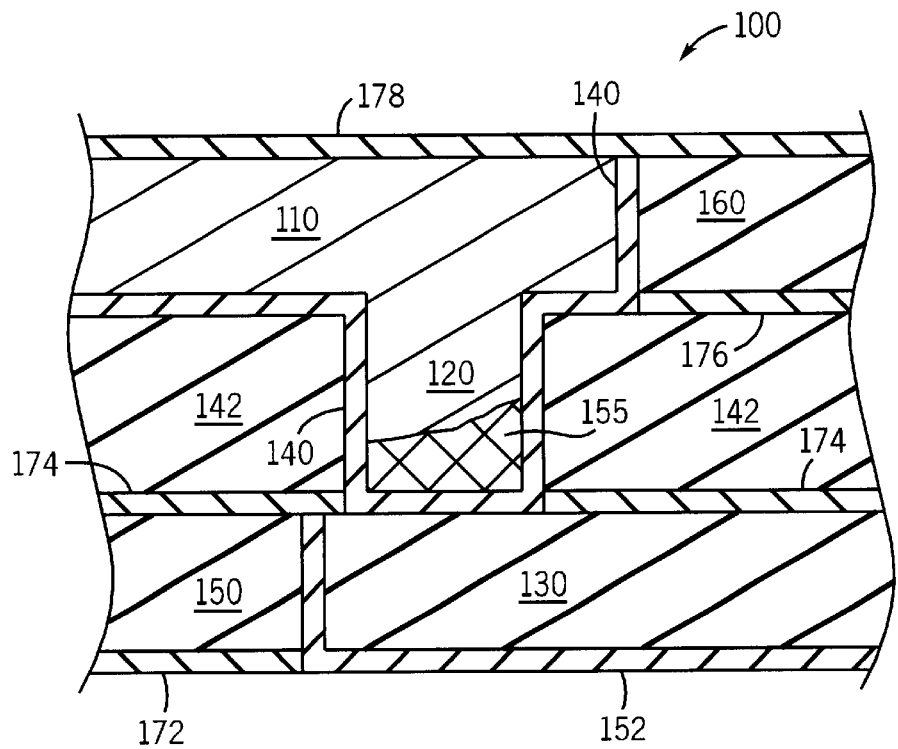
FIG. 3 is a schematic cross-sectional view representation of the dual damascene portion of the integrated circuit illustrated in FIG. 1, showing an electromigration failure.
Figure 7:
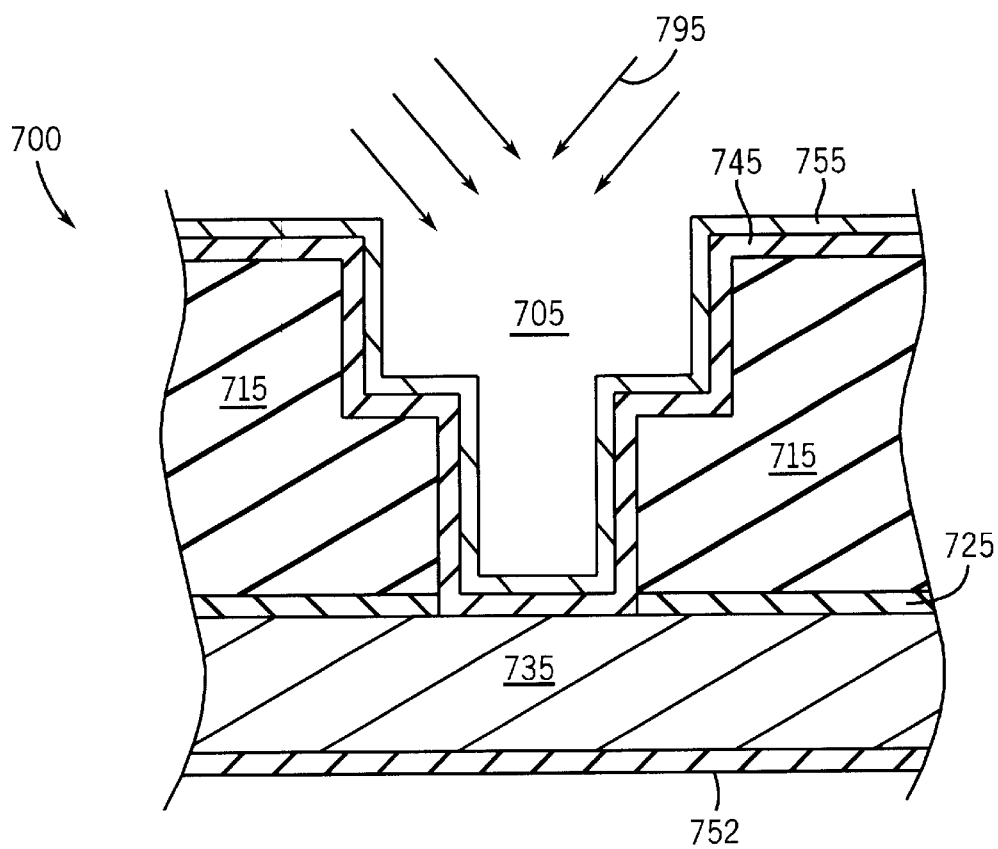
FIG. 7 is a perspective cross-sectional view representation of a portion of an integrated circuit, showing a implantation step.

With reference to FIG. 7, a schematic cross-sectional view representation of a portion 700 of an integrated circuit (IC) includes an aperture 705, a dielectric layer 715, an etch stop layer 725, a copper layer 735, a barrier layer 745, and a seed layer 755. Barrier layer 745 and seed layer 755 form a conformal layer section which can include an implanted layer such as seed/barrier interfacial layer 430, barrier/dielectric interfacial layer 520, or seed implanted layer 630 as described with respect to FIGS. 4–6.

Portion 700 is preferably part of an ultra-large-scale integrated (ULSI) circuit having millions or more transistors. Portion 700 is manufactured as part of the IC on a semiconductor wafer, such as, a silicon wafer.

Aperture 705 is formed in preparation for the creation of a via by etching a portion of dielectric layer 715 and etch stop layer 725. Aperture 705 can have a cross-sectional width of 50–200 nm. Aperture 705 can also have two sections, one having a smaller width than another. For example, a top section of aperture 705 can have a cross-sectional width of 100–150 nm and a bottom section of aperture 705 can have a cross-sectional width of 70–100 nm.

In an exemplary embodiment, dielectric layer 715 is an oxide material and etch stop layer 725 is Silicon Nitride (SiN) or other suitable material. Etch stop layer 725 prevents diffusion of copper from copper layer 735 into dielectric layer 715.

Copper layer 735 can be a layer of copper positioned in proximate location to via section 720. Copper layer 735 can be an alloy including copper (Cu). In an alternative embodiment, copper layer 730 is a stack of several layers.

Barrier layer 745 can be Tantalum (Ta), Titanium Nitride (TiN), Titanium Silicon Nitride (TiSiN), Tungsten Nitride (WNx), or other suitable material. In an exemplary embodiment, barrier layer 745 has a cross sectional thickness of 30–70 Angstroms. Barrier layer 745 can be deposited by ALD and/or CVD. The barrier properties of barrier layer 745 can be enhanced by the addition of an implant, such as, B, P, Si, or Ge.

Seed layer 755 can be a copper alloy, such as, an alloy including C, S, Cl and/or doped with any other suitable material. Seed layer 755 can be deposited by advanced PVD, CVD or ALD. In an exemplary embodiment, seed layer 755 has a cross sectional thickness of 100–300 Angstroms.

Seed layer 755 can include a seed implant as described with reference to FIG. 6. Alternatively, seed layer 755 can be separated from barrier layer 745 by a seed/barrier interfacial layer as described with respect to FIG. 4. Further, in yet another embodiment, barrier layer 745 can be separated from copper layer 735 or dielectric layer 715 by a barrier/dielectric interfacial layer as described with reference to FIG. 5.

In an exemplary method of fabricating portion 700, once copper layer 735 is deposited, etch stop layer 725 is deposited over copper layer 735 and dielectric layer 715 is deposited over etch stop layer 725. A resist layer is then deposited over dielectric layer 715. The resist layer is used in the patterning and etching in dielectric layer 715 and etch stop layer 725 to form aperture 705. The resist layer is removed before depositing via material in aperture 705 and depositing a conductive layer electrically connected to copper layer 735 by the via. Layer 735 is above a layer 752.

Before depositing via material in aperture 705, barrier layer 745 and seed layer 755 are formed along walls of aperture 705. Barrier layer 745 can be formed by ALD and/or CVD. Seed layer 755 can be formed by advanced PVD, CVD, or ALD.

In an exemplary embodiment, after formation of barrier layer 745 and seed layer 755, an implant 795 can be made by an angle implant or an angle implant along with a no-angle implant. Implant 795 can be 35 and/or 65 degrees. The angle implant can be 35 to 90 degrees. In an exemplary embodiment, implant 795 is a dose of, for example, in the range of E16 cm$^2$–E15 cm$^2$ forming a doped monolayer, and is implanted at an energy, such as, 0.25 KeV–5.0 KeV. Implant 795 can form an interfacial or implant layer such as the implant layers described with reference to FIGS. 4–6.

One technique to achieve implantation of implant 795 at a titled angle is by rotating the integrated circuit wafer including portion 700. As such, an implanting device can be directed in one direction and, due to the rotation of the integrated circuit wafer, implant 795 can be provided along side walls all around the aperture of via section 720. In another embodiment, the wafer is tilted to control distribution of implant 795.

Advantageously, the addition of implant 795 allows for the creation of a seed layer including a seed implant as described with reference to FIG. 6. In an alternative embodiment, implant 795 allows for the creation of a seed/barrier interfacial layer separating seed layer 755 can be separated and barrier layer 745 as described with respect to FIG. 4. In yet another embodiment, implant 795 allows for the creation of a barrier/dielectric interfacial layer separating barrier layer 745 and copper layer 735 or dielectric layer 715 by as described with reference to FIG. 5.

Implanting elements, such as, B, P, or Ge after copper seed deposition allows for the creation of mixed layers with uniform distribution of elements. As an example, elements can be implanted using an energy of 1–2 KeV and a dose of 5–7 E15 cm². Such mixed layers including implanted elements can improve adhesion between layers and, further, electromigration reliability. They can also form amorphous portions of barrier layers without large amounts of grain boundaries.

While the exemplary embodiments illustrated in the figures and described above are presently preferred, it should be understood that these embodiments are offered by way of example only. Other embodiments may include, for example, different methods of implanting species. The invention is not limited to a particular embodiment, but extends to various modifications, combinations, and permutations that nevertheless fall within the scope and spirit of the appended claims.

What is claimed is:

1. A method of fabricating an integrated circuit, the method comprising:
   forming a barrier layer along lateral side walls and a bottom of a via aperture, the via aperture being configured to receive a via material that electrically connects a first conductive layer and a second conductive layer;
   forming a seed layer proximate and conformal to the barrier layer; and
   forming an implanted layer proximate and conformal to the barrier layer and the implanted layer, wherein the implanted layer is a barrier/dielectric interfacial layer deposed between the barrier layer and a dielectric layer located below the barrier layer.

2. The method of claim 1, wherein the implanted layer is a seed/barrier interfacial layer deposed between the seed layer and the barrier layer.

3. The method of claim 1, wherein the implanted layer has a high melting point and high density.

4. The method of claim 1, wherein the implanted layer is located within the seed layer.

5. The method of claim 4, wherein the implanted layer is located on top of the seed layer, in a middle of the seed layer, or at a bottom of the seed layer.

6. The method of claim 1, wherein the implanted layer is a mixed region with a uniform distribution of elements contained therein.

7. The method of claim 1, wherein seed layer includes a copper (Cu) alloy.

8. The method of claim 1, wherein the implanted layer has a cross-sectional thickness of 10–30 Angstroms.

9. The method of claim 1, wherein the implanted layer is formed by an angle implant to achieve a uniform distribution of elements.

10. A method of implantation after copper seed deposition in an integrated circuit fabrication process, the method comprising:
    providing a first conductive layer over an integrated circuit substrate;
    providing a conformal layer section at a bottom and sides of a via aperture positioned over the first conductive layer to form a barrier separating the via aperture from the first conductive layer;
    implanting an element into the conformal layer to form an implanted layer in the conformal layer section;
    filling the via aperture with a via material; and
    providing a second conductive layer over the via material such that the via material is disposed between the first conductive layer to the second conductive layer wherein implanting an element into the conformal layer to form an implanted layer in the conformal layer includes forming a barrier/dielectric interfacial layer between a barrier layer in the conformal layer and a dielectric below the conformal layer.

11. The method of claim 10, wherein implanting an element into the conformal layer section to form an implanted layer in the conformal layer section includes forming a seed/barrier interfacial layer between a seed layer and a barrier layer in the conformal layer section.

12. The method of claim 10, wherein implanting an element into the conformal layer to form an implanted layer in the conformal layer section includes forming a barrier/dielectric interfacial layer between a barrier layer in the conformal layer and a dielectric section below the conformal layer section.

13. The method of claim 10, wherein the implanted layer has a high density and a high melting point.

14. The method of claim 10, wherein the implanted layer has a cross-sectional thickness of 10–30 Angstroms.

15. A method of forming a via in an integrated circuit, the method comprising:
    depositing a first conductive layer;
    depositing an etch stop layer over the first conductive layer;
    depositing an insulating layer over the etch stop layer;
    forming an aperture in the insulating layer and the etch stop layer;
    providing a barrier material at a bottom and sides of the aperture to form a barrier layer;
    providing a seed layer over the barrier layer;
    providing an implant into the barrier layer and seed layer to form an implant layer;
    filling the aperture with a via material; and
    providing a second conductive layer over the via such that the via is disposed between the first conductive layer and the second conductive layer wherein the implant layer is a barrier/dielectric interfacial layer disposed between the barrier layer and the insulating layer.

16. The method of claim 15, wherein the implant includes metallic elements of $6^{th}$ period (Ta, W, Re, Os, Ir, Pt), metallic elements of $5^{th}$ period (Nb, Mo, Ru, Rh, Pd), and/or metallic elements of $4^{th}$ period (V, Cr, Fe, Co, Ni).

17. The method of claim 15, wherein the implant layer is a seed/barrier interfacial layer deposed between the seed layer and the barrier layer.

18. The method of claim 15, wherein the implant includes C, B, P, Si, N, Al, As, Ga, or Ge elements.

19. The method of claim 15, wherein the barrier dielectric interfacial layer has a high melting point and a high density,.

20. The method of claim 15, wherein the implant includes Zn, Sn, Cr, Ca, Ag, or In elements.

21. The method of claim 15, wherein the implanted layer is located within the seed layer.

22. The method of claim 15, wherein providing an implant into the barrier layer and seed layer to form an implant layer includes angle implanting the implant.

* * * * *